United States Patent [19]

Hirano

[11] Patent Number: 5,699,424
[45] Date of Patent: Dec. 16, 1997

[54] SYSTEM IDENTIFICATION METHOD AND APPARATUS BY ADAPTIVE FILTER

[75] Inventor: Akihiro Hirano, Tokyo, Japan

[73] Assignee: NEC Corporation, Tokyo, Japan

[21] Appl. No.: 550,996

[22] Filed: Oct. 31, 1995

[30] Foreign Application Priority Data

Nov. 2, 1994 [JP] Japan ................. 6-269523

[51] Int. Cl.$^6$ .................... A61F 11/06; H03B 29/00
[52] U.S. Cl. .................... 379/410; 381/71; 381/94
[58] Field of Search .................... 381/71, 94, 66; 379/406, 410, 411; 370/286; 364/724.19

[56] References Cited

U.S. PATENT DOCUMENTS

| | | | |
|---|---|---|---|
| 4,852,036 | 7/1989 | Kobayashi | 364/724.19 |
| 5,222,084 | 6/1993 | Takahashi | 381/94 |
| 5,305,309 | 4/1994 | Chijo et al. | 379/411 |
| 5,323,459 | 6/1994 | Hirano | 381/66 |
| 5,463,618 | 10/1995 | Furukawa | 379/410 |
| 5,524,149 | 6/1996 | Frenzel | 364/724.19 |
| 5,528,687 | 6/1996 | Tanaka et al. | 370/286 |
| 5,555,310 | 9/1996 | Minami et al. | 381/66 |
| 5,608,804 | 3/1997 | Hirano | 379/410 |

OTHER PUBLICATIONS

Hirano et al., "Proceedings of the 1994 Institute of Electronics, Information and Communication Engineers Conference of Japan in 1994", p. 115.

"The Foundation of an Adaptive Filter (Part 1)", Journal of the Acoustic Society of Japan, vol. 45, No. 8, pp. 624–630.

"The Foundation of an Adaptive Filter (Part 2)", Journal of the Acoustic Society of Japan, vol. 45, No. 9, pp. 731–738.

Nagumo et al., "A Learning Method for System Identification", IEEE Transactions on Automatic Control, vol. AC–12, No. 3, 1967, pp. 282–287.

Sugiyama, "An Interference–Robust Stochastic Gradient Algorithm With A Gradient–Adaptive Step–Size", pp. 539–542, 1993.

Meana et al., "A Time Varying Step Size Normalized LMS Echo Canceler Algorithm", pp. 249–252, 1994.

Widrow et al., "Adaptive Noise Canceling: Principles and Applications", Proceedings of the IEEE vol. 63 No. 12, pp. 1692–1716, 1975.

*Primary Examiner*—Sinh Tran
*Assistant Examiner*—Xu Mei
*Attorney, Agent, or Firm*—Foley & Lardner

[57] ABSTRACT

A system identification apparatus includes an adaptive filter which processes a reference input signal to obtain an output signal, a subtractor which subtracts the output signal from an observation signal, a pair of mean power estimation circuits which estimate a short-term mean power and a long-term mean power of the reference input signal, respectively, and a power estimation circuit which estimates the power of the reference input signal based on the two mean powers.

24 Claims, 11 Drawing Sheets

SYSTEM IDENTIFICATION METHOD AND APPARATUS BY ADAPTIVE FILTER

BACKGROUND OF THE INVENTION

1. Field of the Invention

This invention relates to a system identification method and apparatus by an adaptive filter for use with an echo canceller, a noise canceller or a like apparatus.

2. Description of the Prior Art

As a system identification method and apparatus for estimating a characteristic of an unknown system using an adaptive filter, a system identification method and apparatus disclosed in "IEEE transactions on automatic control", Vol. AC-12, No. 3, pp.282–287, 1967, U.S.A. is well known, in which a transversal adaptive filter is employed based on a learning identification method. Here, the principle of operation of a transversal adaptive filter based on a learning identification method is described by way of an example wherein it is applied to an acoustic echo canceller.

FIG. 1 shows a block diagram of an acoustic echo canceller based on a learning identification method. In FIG. 1, a system identification apparatus is employed as echo canceller 130.

Loudspeaker 10 converts reference input signal 1 inputted thereto into an acoustic signal. The acoustic signal converted by loudspeaker 10 propagates along acoustic path 11, which is an unknown system, and arrives at microphone 12. Thereupon, an echo (acoustic echo) is generated in the acoustic signal. Microphone 12 converts the acoustic signal together with noise 2 into an electric signal and outputs the electric signal as observation signal 3.

Echo canceller 130 removes the influence of an echo included in observation signal 3 outputted from microphone 12. Echo canceller 130 includes adaptive filter 101, subtractor 102, step size setting circuit 110 and power estimation circuit 131.

Adaptive filter 101 performs convolution calculation of reference input signal 1 and filter coefficients and supplies a result of the convolution calculation as output signal 5 to subtractor 102. Subtractor 102 subtracts output signal 5 supplied thereto from adaptive filter 101 from observation signal 3 outputted from microphone 12 and outputs the result of the subtraction as error signal 4. Error signal 4 outputted from subtractor 102 is outputted as an output signal of echo canceller 130 and also is supplied (feed back) to adaptive filter 101.

Power estimation circuit 131 estimates the power of reference input signal 1 and supplies the result of the estimation (estimated value 109 of the power) to adaptive filter 101. Step size setting circuit 110 supplies set step size μ to adaptive filter 101 (step size 111).

In echo canceller 130 described above, adaptive filter 101 updates the filter coefficients, so as to minimize error signal 4 as an output signal of echo canceller 130, using reference input signal 1 inputted to echo canceller 130, estimated value 109 supplied from power estimation circuit 131, step size 111 supplied from step size setting circuit 110 and error signal 4 outputted (feed back) from subtractor 102.

The sequence of operations described above can be represented in the following expressions. The impulse response of acoustic path 11 is represented by h(i) (i=0, ..., N–1), reference input signal 1 at time t is represented by x(t), noise 2 is represented by n(t), and observation signal 3 is represented by d(t). The relationship between reference input signal x(t), noise n(t) and observation signal d(t) is given by $$d(t) = \sum_{i=0}^{N-1} h(i)x(t-i) + n(t) \quad (1)$$

Where the number of taps of adaptive filter 101 is represented by N and the filter coefficients is represented by w(i, t) (i=0, ..., N–1), output signal y(t) of adaptive filter 101 is given by $$y(t) = \sum_{i=0}^{N-1} w(i, t)x(t-i) \quad (2)$$

From expressions (1) and (2), error signal e(t) is given by $$\begin{aligned} e(t) &= d(t) - y(t) \\ &= \sum_{i=0}^{N-1} \{h(i) - w(i, t)\}x(t-i) + n(t) \end{aligned} \quad (3)$$

Updating of filter coefficient w(i, t) is given, using step size μ, by $$w(i, t+1) = w(i, t) + \frac{\mu e(t)x(t-i)}{NPx(t)} \quad (4)$$

where Px(t) is a simple mean power $$Px(t) = \frac{1}{N} \sum_{i=0}^{N-1} x^2(t) \quad (5)$$

of x(t), and μ is a constant within the range of $$0 < \mu < 2$$

In the learning identification method, the filter coefficients are modified using error signal e(t). It can be seen from expression (3) that error signal e(t) includes noise n(t) in addition to system identification error h(i)–w(i, t). When noise n(t) is sufficiently low compared with the output of the unknown system, the filter coefficients can be modified correctly using the learning identification method to identify a characteristic of the unknown system.

However, the modification to the filter coefficients using the learning identification method described above has a problem in that, when noise n(t) is high, the filter coefficients cannot be modified correctly. Further, where reference input signal x(t) is non-stationary signal such as voice, even when noise n(t) is comparatively low, the filter coefficients sometimes cannot be modified correctly. It is considered that this arises from the following reason.

From expression (4), since the updating amount of filter coefficient w(i, t) increases in inverse proportion to power Px(t) of the reference input signal, when reference input signal x(t) is very low, the updating amount of filter coefficient w(i, t) is very great. Meanwhile, the output signal of acoustic path 11 is very small, and error signal e(t) includes noise n(t) by a comparatively great amount. Accordingly, it is considered that filter coefficient w(i, t) is updated by a great amount not using identification error h(i)–w(i, t) of the unknown system but using noise n(t) and this prevents correct updating of the filter coefficients.

As an estimation method for reference input signal power Px(t) in a learning identification method, a method which uses leaky integration is disclosed in "The Foundation of an Adaptive Filter (Part 2)", Journal of the Acoustic Society of Japan, Vol. 45, No. 9, pp.731–738. An outline of the method is described below.

Where leaky integration is used, Px(t) is obtained by $$Px(t) = \alpha Px(t-1) + \beta x^2(t) \quad (7)$$

where α and β are constants within the ranges of $$0 < \alpha < 1 \qquad (8)$$

$$0 < \beta \qquad (9)$$

respectively, and in most cases, $$\beta = 1 - \alpha \qquad (10)$$

When power Px(t) of non-stationary reference input signal is calculated using leaky integration, the behavior of the adaptive filter relies upon a time constant of leaky integration defined by constant α. When the time constant is substantially equal to number of taps N of the adaptive filter, a similar result to that obtained using a simple mean power is obtained. When the time constant is set long, the follow-up rate of Px(t) becomes slow and the response to an increase or decrease of the power becomes slow.

If the follow-up to a decrease of the power becomes slow, then even if the reference input signal decreases, estimated value Px(t) of the power still has a high value. In this instance, the problem of the learning identification method, that is, a drop of the performance by noise arising from division by a low power does not occur. Accordingly, an improvement in performance against noise can be anticipated.

On the other hand, if the follow-up to an increase of the power becomes slow, then even if the reference input signal becomes high, estimated value Px(t) of the power will still keep a low value. As a result, the updating amount of the filter coefficients may possibly become excessively high, resulting in divergence of the filter coefficients. However, the document mentioned above does not disclose a criterion for selection of a time constant for leaky integration or a method for preventing a divergence of filter coefficients.

As described above with reference to FIG. 1, an adaptive filter which is based on a learning identification method using a simple mean power has a problem in that, when noise is high, the filter coefficients cannot be modified correctly. Meanwhile, a learning identification method which uses leaky integration has another problem in that the filter coefficients may possibly diverge.

The adaptive filter described above is explained particularly in the following documents:

(1) "The Foundation of an Adaptive Filter (Part 1)", Journal of the Acoustic Society of Japan, Vol. 45, No. 8, pp.624–630: this discloses an adaptive filter using an LMS algorithm, which particularly makes use of a method of steepest descent; and (2) Proceedings of the 1994 Institute of Electronics, Information and Communication Engineers Fall Conference of Japan in 1994, p.115: this document discloses an acoustic echo canceller which makes use of an algorithm wherein a parameter of a variable step size method is varied in response to a noise level.

SUMMARY OF THE INVENTION

It is an object of the present invention to provide a system identification method and apparatus using an adaptive filter wherein, solving the problems described above, filter coefficients can be updated correctly even in a high noise environment and, even if a reference input signal power varies suddenly, a stable operation is assured.

In order to attain the object described above, according to a first aspect of the present invention, there is provided a system identification method wherein an output signal, obtained by processing a reference input signal by means of an adaptive filter is subtracted from an observation signal which includes an output signal of an unknown system and noise to obtain an error signal and coefficients of the adaptive filter, is modified using at least the error signal, the reference input signal, an estimated value of a power of the reference input signal and a step size so as to minimize the error signal to estimate a characteristic of the unknown system, comprising the steps of calculating a short-term mean power obtained by averaging the power of the reference input signal for a short time and a long-term mean power obtained by averaging the power of the reference input signal for a long time, and calculating an estimated value of the power of the reference input signal based on at least the short-term mean power and the long-term mean power.

According to a second aspect of the present invention, there is provided a system identification method according to the first aspect of the present invention, wherein, upon calculation of the estimated value of the power of the reference input signal, a first threshold value is set based on at least the short-term mean power, and when the long-term mean power is lower than the first threshold value, the first threshold value is used as the estimated value of the power of the reference input signal, but in any other case, the long-term mean power is used as the estimated value of the power of the reference input signal.

According to a third aspect of the present invention, there is provided a system identification method according to the second aspect of the present invention, wherein, upon calculation of the first threshold value, the short-term mean power and the step size are used.

According to a fourth aspect of the present invention, there is provided a system identification method according to the second or third aspect of the present invention, wherein, upon calculation of the long-term mean power, a second threshold value is set based on the long-term mean power, and when the short-term mean power is higher than the second threshold value, the long-term mean power is updated using the reference input signal, but in any other case, the long-term mean power is not updated.

According to a fifth aspect of the present invention, there is provided a system identification method according to any one of the second to fourth aspects of the present invention, wherein, upon calculation of the long-term mean power, when the long-term mean power is lower than the first threshold value, the long-term mean power is replaced with the first threshold value.

In order to attain the object described above, according to a sixth aspect of the present invention, there is provided a system identification apparatus wherein a result of processing of a reference input signal by means of an adaptive filter is subtracted from an observation signal which includes an output signal of an unknown system and noise to obtain an error signal and coefficients of the adaptive filter are modified based on the error signal to estimate a characteristic of the unknown system, comprising an adaptive filter for obtaining an output signal using at least the reference input signal and filter coefficients, a subtractor for subtracting an output signal of the adaptive filter from an observation signal which includes an output signal of the unknown .system and noise to obtain an error signal and supplying the error signal to the adaptive filter, a short-term mean power estimation circuit for estimating a short-term mean power which is a short-term mean value of a power of the reference input signal, a long-term mean power estimation circuit for estimating a long-term mean power which is a long-term mean value of the power of the reference input signal based on at least the reference input signal, a power estimation circuit for calculating an estimated value of the power of the reference input signal based on at least the short-term mean power and the long-term mean power, and a step size setting circuit for setting a step size, the coefficient of the adaptive filter being modified using at least the error signal, the reference input signal, the estimated value of the power and the step size so as to minimize the error signal to estimate the unknown system.

According to a seventh aspect of the present invention, there is provided a system identification apparatus according to the sixth aspect of the present invention, wherein the power estimation circuit includes at least a first threshold value setting circuit for setting a first threshold value based on at least the short-term mean power, a first comparator for comparing the long-term mean power and the first threshold value with each other, and a selector for selecting, based on the result of the comparison of the first comparator, the greater one of the first threshold value and the long-term mean power and outputting the selected value as the estimated value of the power.

According to an eighth aspect of the present invention, there is provided a system identification apparatus according to the sixth aspect of the present invention, wherein the power estimation circuit includes at least a first threshold value setting circuit for setting a first threshold value based on at least the short-term mean power, a first comparator for comparing the long-term mean power and the first threshold value with each other, a selector for selecting, based on the result of the comparison of the first comparator, the greater one of the first threshold value and the long-term mean power and outputting the selected value as the estimated value of the power, a second threshold value setting circuit for setting a second threshold value based on the long-term mean power, a second comparator for comparing the short-term mean power and the second threshold value with each other and supplying a power estimation control signal for instruction to update the short-term mean power when the short-term mean power is higher than the second threshold value, but supplying, in any other case, another power estimation control signal for instruction not to update the short-term mean power, to the long-term mean power estimation circuit, and a long-term mean power estimation circuit estimating the long-term mean power in response to the instruction of the power estimation control signal.

According to a ninth aspect of the present invention, there is provided a system identification apparatus according to the seventh or eighth aspect of the present invention, wherein the first threshold value setting circuit sets the first threshold value based on the short-term mean power and the step size.

According to a tenth aspect of the present invention, there is provided a system identification apparatus according to the sixth, seventh or ninth aspect of the present invention, wherein the long-term mean power estimation circuit updates the long-term mean power based on the reference input signal and the estimated value of the power when the power estimation control signal instructs updating of the long-term mean power, but in any other case, the long-term mean power uses the estimated value of the power as the long-term mean power.

In the system identification method and apparatus of the present invention described above, by calculating a power of a reference input signal using a short-term mean power and a long-term mean power of the reference input signal, the filter coefficients can be updated correctly even in such an environment that the reference input signal is non-stationary and noise is high. Further, even if the power of the reference input signal varies suddenly, the filter coefficients will not diverge.

Accordingly, where the system identification method and apparatus of the present invention described above is employed, by estimating the power of a reference input signal using a short-term mean power and a long-term mean power, there is an effect in that the filter coefficients can be updated correctly in an environment wherein noise is mixed and a stabilized operation is assured even if the input signal power varies suddenly.

DESCRIPTION OF THE PREFERRED
EMBODIMENT(S)

Embodiments of the present invention are described in detail below with reference to FIGS. 2 to 11 taking, as an example, an echo canceller which removes an acoustic echo when a reception signal propagates from a loudspeaker along a spatial acoustic path and is collected by a microphone. In the example described below, a system identification apparatus is employed as an echo canceller.

Figure 1:
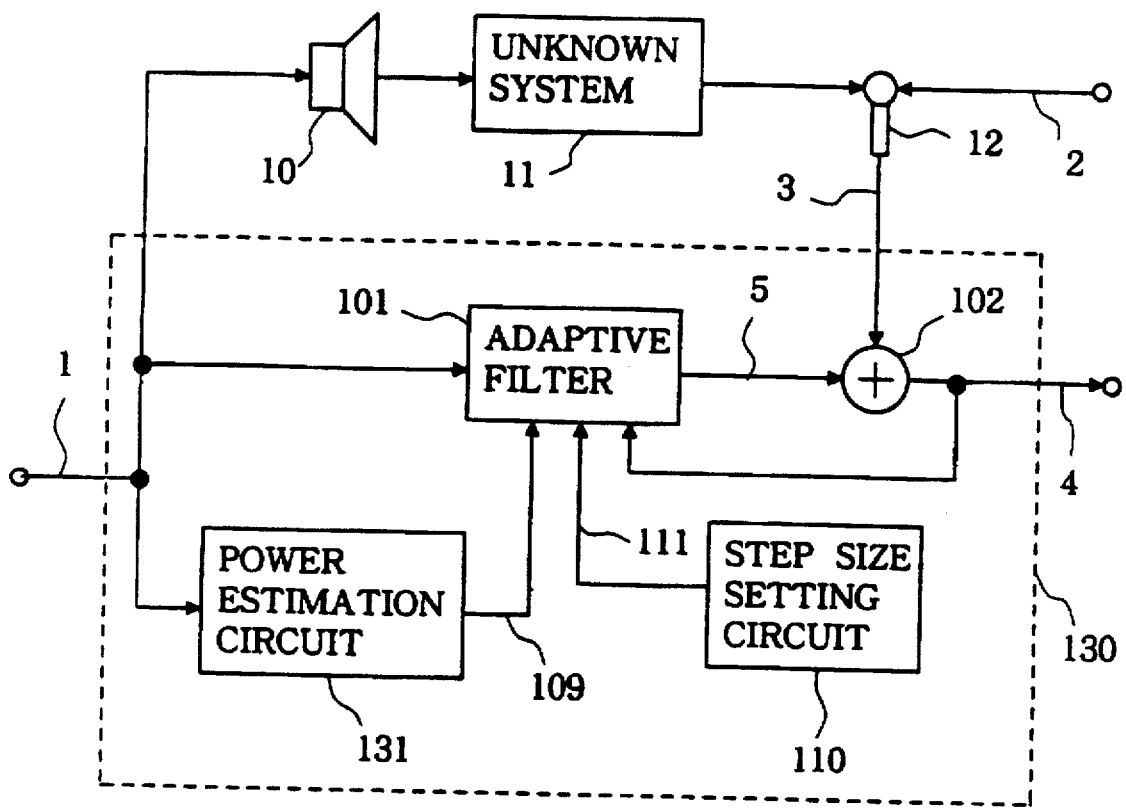
FIG. 1 is a block diagram of a conventional echo canceller.
Figure 2:
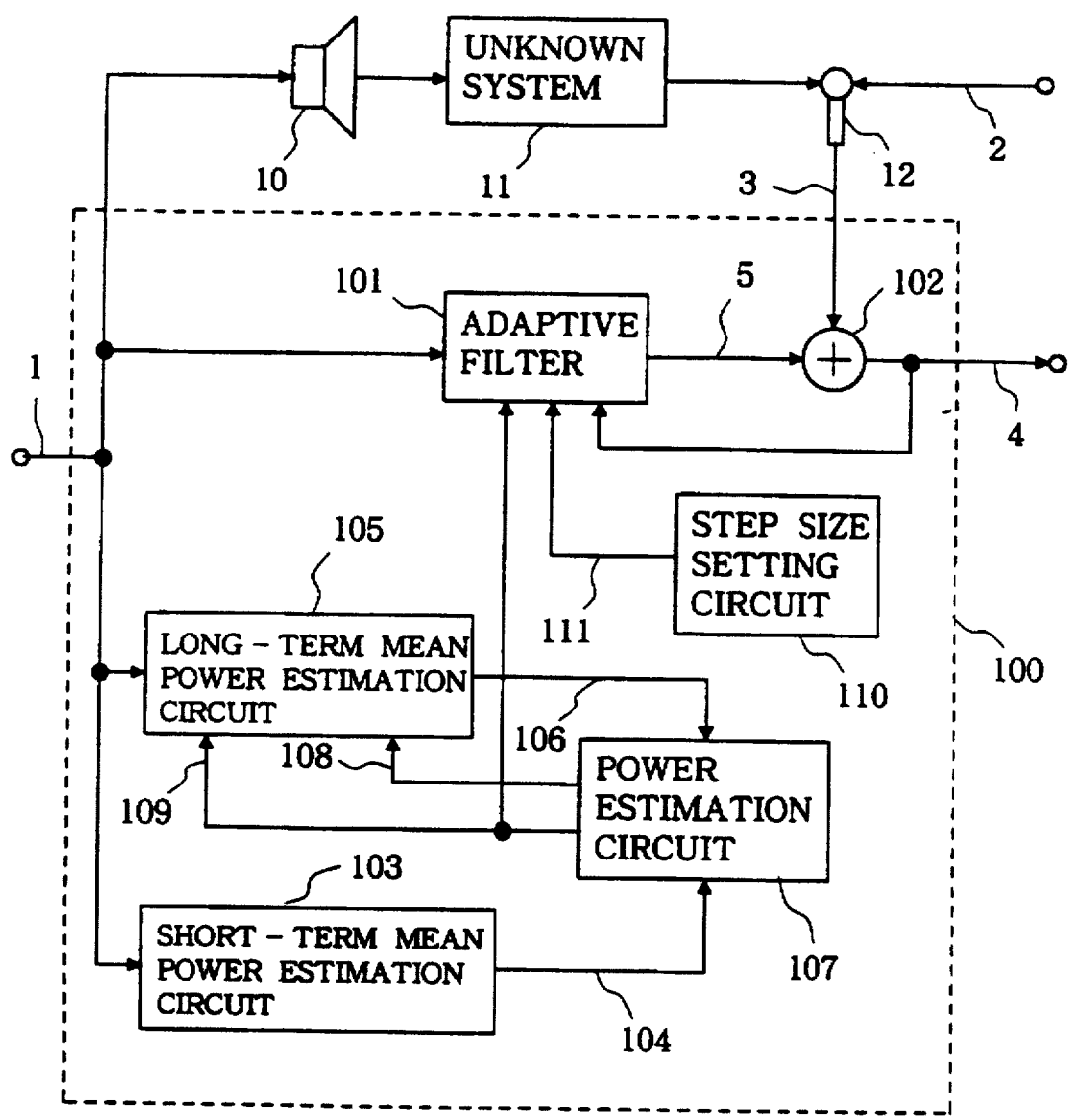
FIG. 2 is a block diagram showing an echo canceller which is a first embodiment of a system identification apparatus of the present invention.

FIG. 2 is a block diagram showing the echo canceller of the first embodiment of the present invention.

Loudspeaker 10 converts reference input signal 1 inputted thereto into an acoustic signal. The acoustic signal converted by loudspeaker 10 propagates along acoustic path 11 which is an unknown system, and comes to microphone 12.

Thereupon, an echo (acoustic echo) is generated in the acoustic signal. Microphone 12 converts the acoustic signal together with the echo and noise 2 into an electric signal and outputs the electric signal as observation signal 3.

Echo canceller 100 removes the influence of the echo included in observation signal 3 outputted from microphone 12. Echo canceller 100 includes adaptive filter 101, subtractor 102, short-term mean power estimation circuit 103, long-term mean power estimation circuit 105, power estimation circuit 107 and step size setting circuit 110.

Adaptive filter 101 performs convolution calculation of reference input signal 1 .and filter coefficients and supplies the result of the convolution calculation as output signal 5 to subtractor 102. Subtractor 102 subtracts output signal 5 supplied thereto from adaptive filter 101 from observation signal 3 outputted from microphone 12, and outputs the result of the subtraction as error signal 4. Error signal 4 outputted from subtractor 102 is outputted as an output signal of echo canceller 100 and also is supplied (feed back) to adaptive filter 101.

Short-term mean power estimation circuit 103 estimates the short-term mean value of the power of reference input signal 1 inputted thereto and supplies a result of the estimation (short-term mean power 104) to power estimation circuit 107.

Power estimation circuit 107 estimates the power of reference input signal 1 based on short-term mean power 104 supplied thereto from short-term mean power estimation circuit 103 and long-term mean power 106 estimated by long-term mean power estimation circuit 105, which will be hereinafter described, and supplies the result of the estimation (estimated value 109 of the power) to adaptive filter 101 and long-term mean power estimation circuit 105. Further, power estimation circuit 107 supplies, to long-term mean power estimation circuit 105, power estimation control signal 108 for controlling the operation of long-term mean power estimation circuit 105.

Long-term mean power estimation circuit 105 estimates a long-term mean value of the power of reference input signal 1 based on reference input signal 1 inputted to echo canceller 100 and estimate value 109 of the power of reference input signal 1 and power estimation control signal 108 supplied thereto from power estimation circuit 107, and supplies the result of the estimation (long-term mean power 106) to power estimation circuit 107.

Step size setting circuit 110 supplies set step size μ (step size 111) to adaptive filter 101.

In echo canceller 100 described above, adaptive filter 101 modifies the filter coefficients so as to minimize error signal 4, which is an output signal of echo canceller 100, using reference input signal 1 inputted to echo canceller 100, estimated value 109 of the power supplied from power estimation circuit 107, step size 111 supplied from step size setting circuit 110 and error signal 4 outputted (feed back) from subtractor 102.

Figure 3:
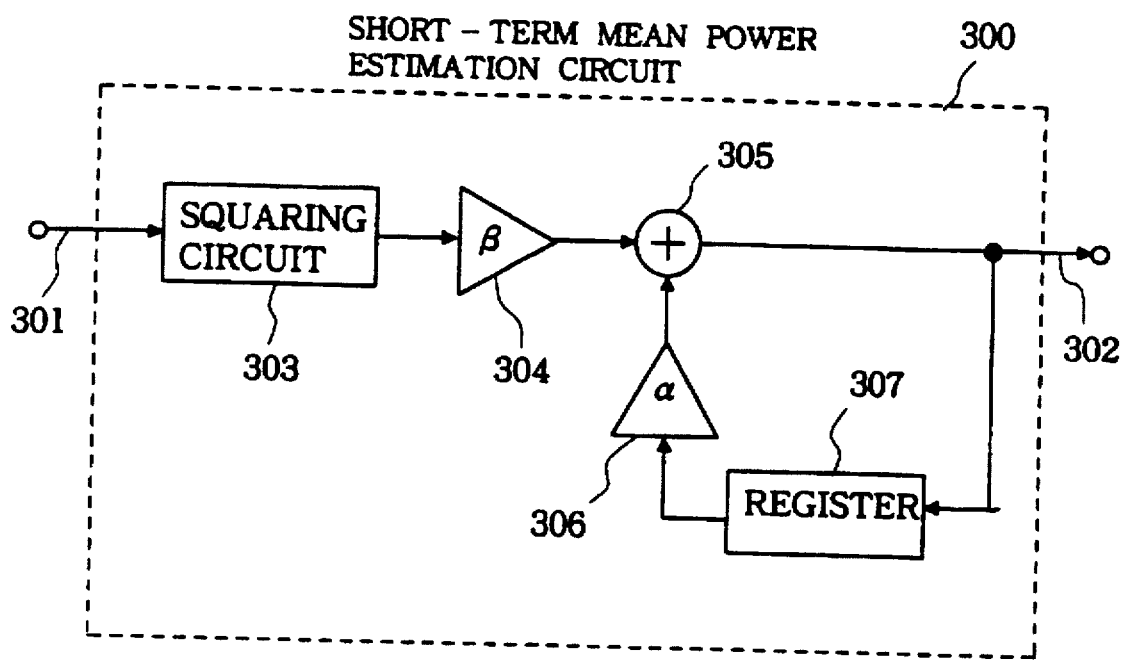
FIG. 3 is a block diagram showing a form of a short-term mean power estimation circuit employed in the system identification apparatus of the present invention.

FIG. 3 shows a construction of a form of short-term mean power estimation circuit 103. The present short-term mean power estimation circuit 300 calculates the mean power of input signal 301 by means of a first-order leaky integrator and outputs the result of the calculation as mean power 302.

Squaring circuit 303 squares input signal 301 and supplies the result of the squaring to first coefficient multiplier 304. First coefficient multiplier 304 multiplies the received result of the squaring by constant β and supplies the result of the multiplication to adder 305. Adder 305 adds the result of the multiplication of first coefficient multiplier 304 and the result of multiplication of second coefficient multiplier 306 and outputs the result of the addition as mean power 302. Further, adder 305 supplies the result of the addition to register 307. Register 307 delays the result of the addition of adder 305 by one sampling interval and supplies the result of the delaying to second coefficient multiplier 306. Second coefficient multiplier 306 multiplies the value supplied thereto from register 307 by constant α and supplies the result of the multiplication to adder 305.

Constant α defines a time constant of leaky integration and is a positive constant smaller than 1.0. As the value of α increases, the time constant increases. Constant β is an arbitrary positive value. In the filter coefficients updating represented by expression (4), since N times reference input signal power Px(t) is used, β should be set to $$\beta = N(1-\alpha) \qquad (11)$$

to obtain N times a weighted square mean value of input signal 301.

While a mean value is calculated by first order leaky integration here, a filter of an arbitrary order may be used for calculation of the mean value. Further, not a weighted mean value but a simple mean value may be calculated.

Figure 4:
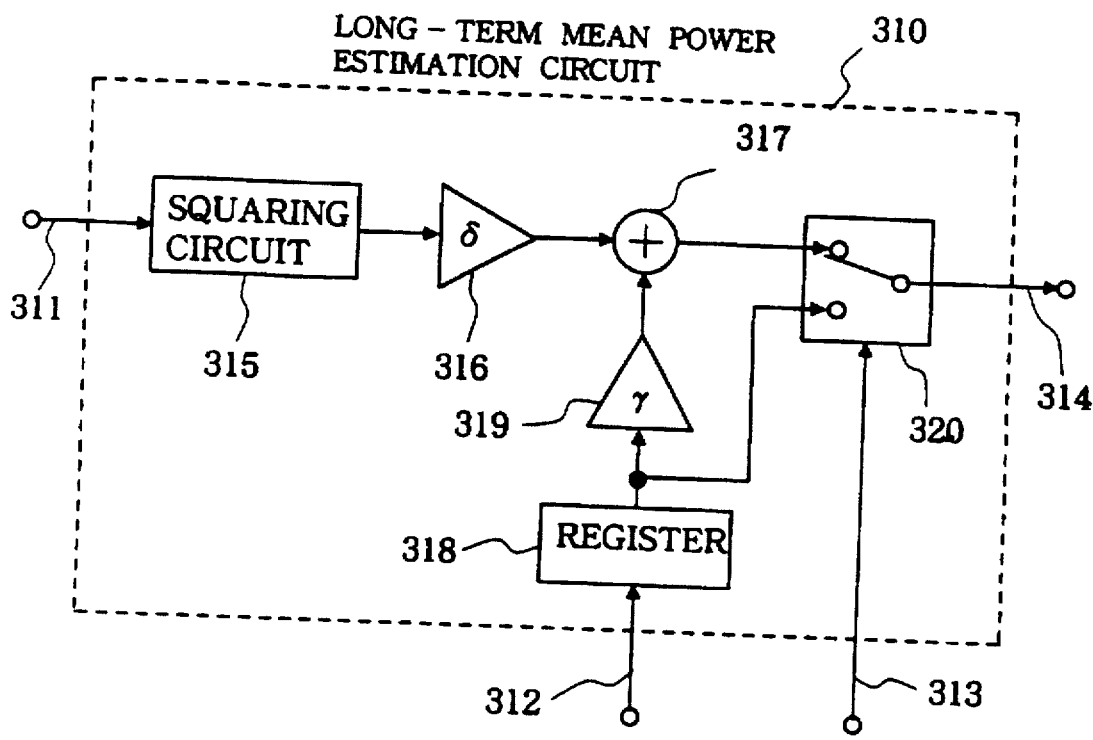
FIG. 4 is a block diagram showing a form of a long-term mean power estimation circuit employed in the system identification apparatus of the present invention.

FIG. 4 shows a construction of a form of long-term mean power estimation circuit 105. The present long-term mean power estimation circuit 310 calculates long-term mean power 314 of input signal 311 based on input signal 311, mean power estimated value 312 and power estimation control signal 313. Power estimation control signal 313 is a signal to instruct whether long-term mean power 314 should be modified based on input signal 311 and mean power estimated value 312 or a past value of long-term mean power 314 should be maintained as it is.

Squaring circuit 315 squares input signal 311 and supplies the result of the squaring to first coefficient multiplier 316. First coefficient multiplier 316 multiplies the result of the squaring by predetermined constant δ and supplies the result of the multiplication to adder 317.

Register 318 delays mean power estimated value 312 by one sampling interval and supplies the result of the delaying to second coefficient multiplier 319 and selector 320. Adder 317 adds results of the multiplication of first coefficient multiplier 316 and second coefficient multiplier 319 and supplies the result of the addition to selector 320.

Selector 320 selects the value stored in register 318 when an instruction to keep a past value is inputted thereto by power estimation control signal 313, but selects the result of the addition of adder 317 when another instruction to update the estimated value of the power is inputted thereto. The result of the selection is outputted as output signal 314 of long-term mean power estimation circuit 310.

Constant γ defines a time constant of leaky integration and is a positive constant lower than 1.0. Since the time constant of the long-term mean power estimation circuit must be set longer than the time constant of the short-term mean power estimation circuit, γ is set so as to fall within the range of $$0 < \alpha < \gamma < 1 \qquad (12)$$

While constant δ is an arbitrary positive value, it should be set, similarly to constant β, to $$\delta = N(1-\gamma) \qquad (13)$$

so as to obtain N times the weighted square mean value of input signal 311.

While a mean value is calculated by first order leaky integration here, a filter of an arbitrary order number can be used for calculation of the mean value.

Figure 5:
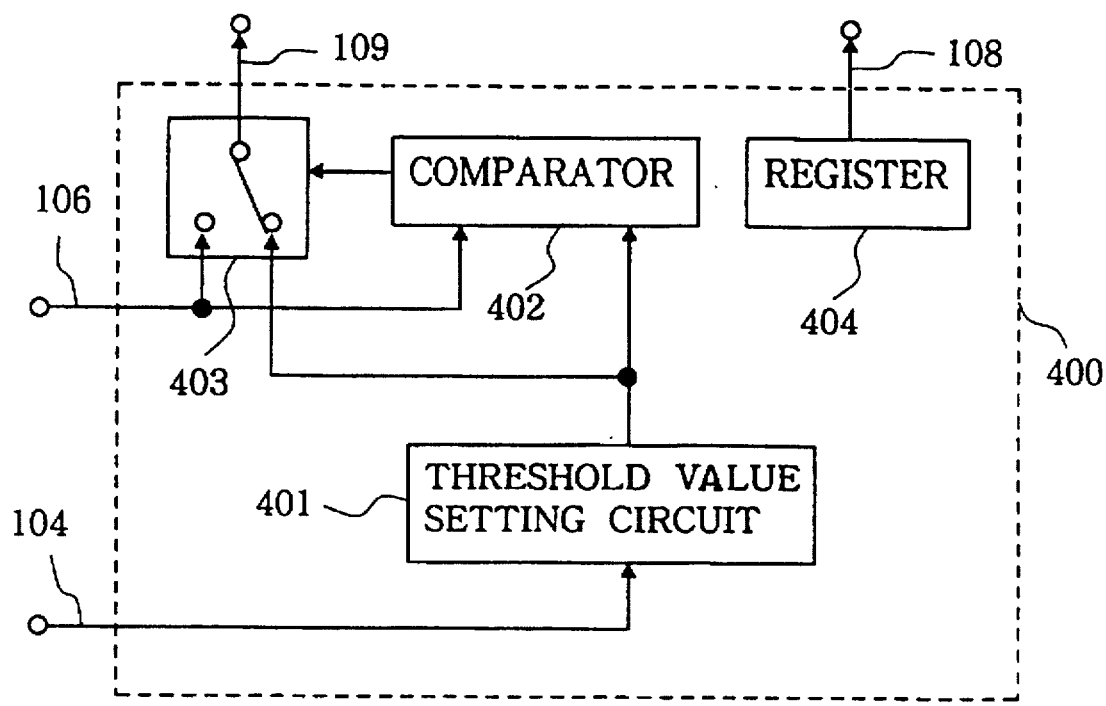
FIG. 5 is a block diagram showing a first form of a power estimation circuit employed in the system identification apparatus of the present invention.

FIG. 5 shows a first form of power estimation circuit 107. The present power estimation circuit 400 receives short-term mean power 104 and long-term mean power 106 as inputs thereto and outputs power estimation control signal 108 and estimated value 109 of the power.

Threshold value setting circuit 401 sets, based on short-term mean power 104, a threshold value which defines a lower limit of estimated value 109 of the power, and supplies the threshold value to comparator 402 and selector 403. Comparator 402 compares the threshold value supplied thereto from threshold value setting circuit 401 with long-term mean power 106 and supplies the result of the addition to selector 403.

Selector 403 selects the threshold value supplied from threshold value setting circuit 401 and long-term mean power 106 which has been determined to be greater by comparator 402, and outputs the selected value as estimated value 109 of the power. Register 404 outputs power estimation control signal 108 for instruction to always update the long-term mean power.

As a method of setting the threshold value, an arbitrary function of short-term mean power 104 can be used. In order to cause the adaptive filter to operate stably, preferably a function which increases monotonously as short-term mean power 104 increases is employed. The most simple example is to use a threshold value which increases in proportion to short-term mean power 104. Short-term mean power 104 itself may be used as the threshold value.

A transversal adaptive filter which is a form of adaptive filter 101 is described below. Output signal y(t) of the adaptive filter is given by expression (2), and updating of filter coefficient w(i, t) is given by expression (4). Those processes can be realized by a cascade connection of calculation circuits which perform calculation for one tap. The jth calculation circuit (j=1, ..., N) receives delay unit input xin(j, t), adder input yin(j, t) and filter coefficients updating amount $\Delta$(t) as inputs thereto and performs a delaying process $$xout(j, t) = xin(j, t-1) \quad (14)$$

a convolution calculation $$yout(j, t) = yin(j, t) + w(j-1, t)xin(j, t) \quad (15)$$

and coefficient updating $$W(j-1, t+1) = w(j-1, t) + \Delta(t)xin(j, t) \quad (16)$$

and then outputs delay unit output xout(j, t) and adder output yout(j, t). Here, xin(1, t) and yin(1, t) are given by $$xin(1, t) = x(t) \quad (17)$$

$$yin(1, t) = 0 \quad (18)$$

respectively, and filter coefficients updating amount $\Delta$(t) is defined as $$\Delta(t) = \mu e(t)/NPx(T) \quad (19)$$

Figure 6:
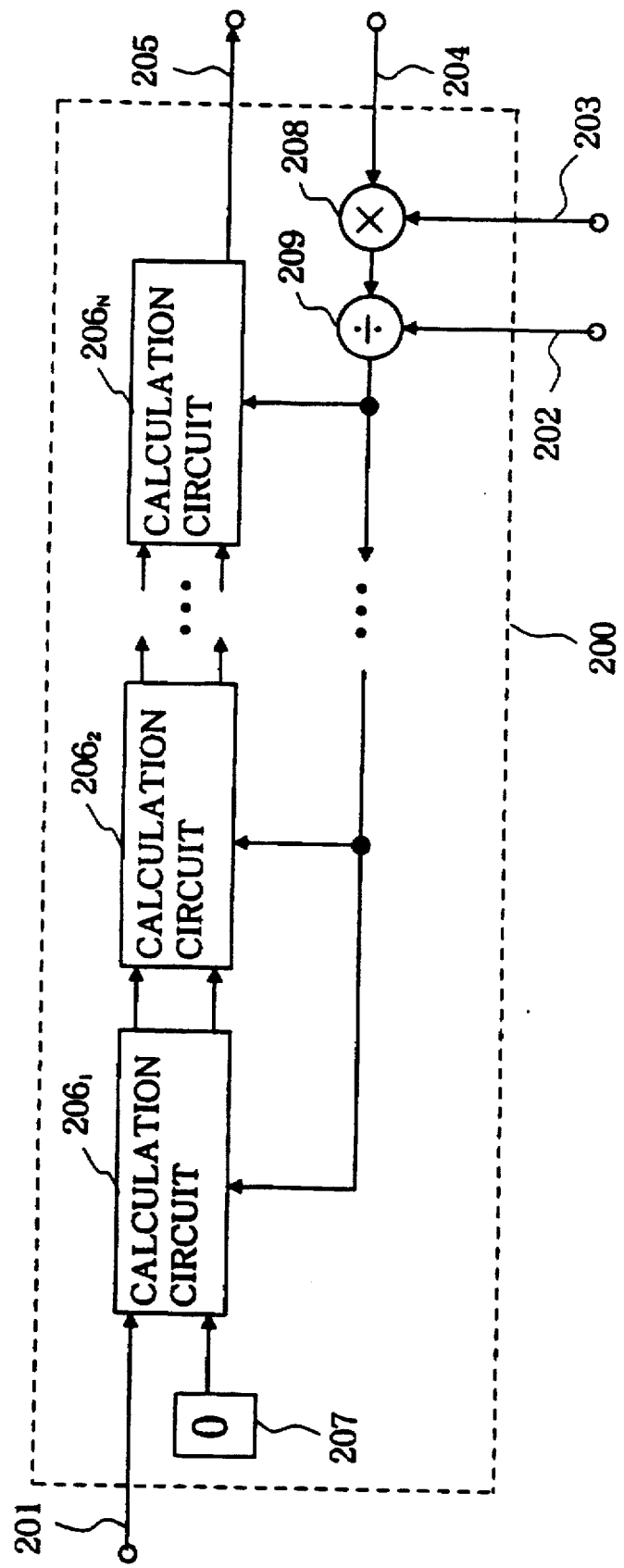
FIG. 6 is a block diagram of an adaptive filter in the present invention.

FIG. 6 shows a form of adaptive filter 101. The present adaptive filter 200 receives reference input signal 201 as an input thereto and produces output signal 205. Further, the filter coefficients of adaptive filter 200 is updated so as to minimize error signal 204. Reference input signal 201 to adaptive filter 200 is supplied as delay unit input xin(1, t) to first calculation circuit $206_1$.

First calculation circuit $206_1$ receives reference input signal 201 to adaptive filter 200 as delay unit input xin(1, t) and receives the constant 0 stored in first constant register 207 as adder input yin(1, t), and performs a delay process, a convolution calculation and coefficient updating. Further, first calculation circuit $206_1$ supplies delay unit output xout(1, t) to delay unit input xin(2, t) of second calculation circuit $206_2$ and supplies adder output yout(1, t) to adder input yin(2, t) of second calculation circuit $206_2$.

Second calculation circuit $206_2$ receives delay unit output xout(1, t) of first calculation circuit $206_1$ as delay unit input xin(2, t) and receives adder output yout(1, t) of first calculation circuit $206_1$ as adder input yin(2, t), and performs a delay process, a convolution calculation and coefficient updating. Further, second calculation circuit $206_2$ supplies delay unit output xout(2, t) to delay unit input xin(3, t) of third calculation circuit $206_3$ and supplies adder output yout(2, t) to adder input yin(3, t) of third calculation circuit $206_3$.

Similarly to second calculation circuit $206_2$, jth calculation circuit $206_j$ (j=3, ..., N-1) receives delay unit output xout(j-1, t) of j-1th calculation circuit $206_{j-1}$ as delay unit input xin(j, t) and receives adder output yout(j-1, t) of j-1th calculation circuit $206_{j-1}$ as adder input yin(j, t), and performs a delay process, a convolution calculation and coefficient updating. jth calculation circuit $206_j$ supplies delay unit output xout(j, t) to delay unit input xin(j+1, t) of j+1th calculation circuit $206_{j+1}$ and supplies adder output yout(j, t) to adder input yin(j+1, t) of j+1th calculation circuit $206_{j+1}$.

Similarly, Nth calculation circuit $206_N$ receives delay unit output xout(N-1, t) of N-1th calculation circuit $206_{N-1}$ as delay unit input xin(N, t) and receives adder output yout (N-1, t) of N-1th calculation circuit $206_{N-1}$ as adder input yin(N, t), and performs a delay process, a convolution calculation and coefficient updating. Adder output yout(N, t) of Nth calculation circuit $206_N$ is used as output signal 205 of adaptive filter 200. Delay unit output xout(N, t) of Nth calculation circuit $206_N$ is not used.

Multiplier 208 multiplies error signal 204 by step size 203 and supplies the result of the multiplication to divider 209. Divider 209 divides the result of the multiplication of multiplier 208 by estimated value 202 of the power to obtain filter coefficient updating amount $\Delta$(t) and supplies filter coefficient updating amount $\Delta$(t) to N calculation circuits $206_1, \ldots, 206_N$.

Figure 7:
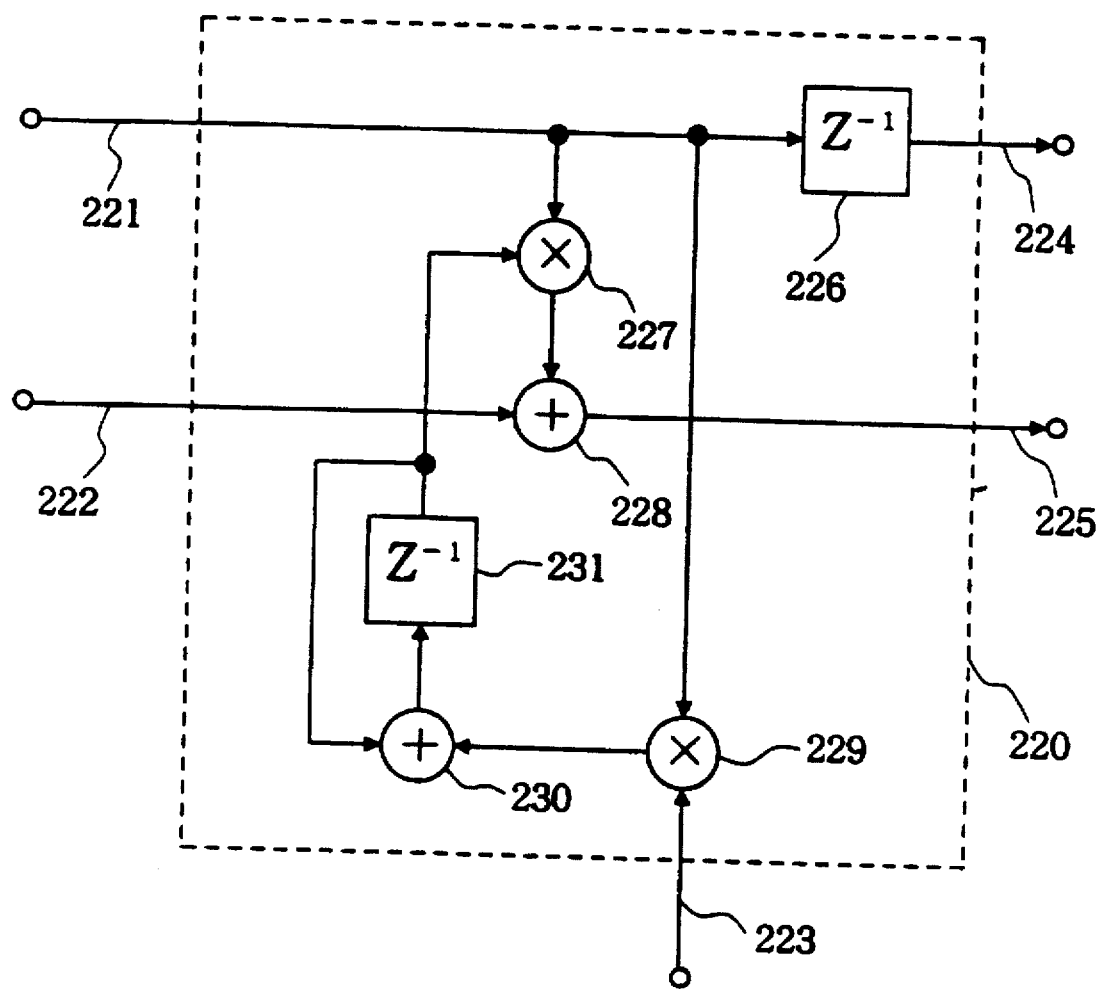
FIG. 7 is a block diagram of a calculation circuit shown in FIG. 6.

FIG. 7 shows a form of calculation circuits $206_1, \ldots, 206_N$. Referring to FIG. 7, the present calculation circuit 220 receives delay unit input 221, adder input 222 and filter coefficient updating amount 223 as inputs thereto, performs a delaying process, a convolution calculation and coefficient updating and outputs delay unit output 224 and adder output 225.

Delay unit input 221 is supplied to delay unit 226 and first multiplier 227. Delay unit 226 delays delay unit input 221 by one sampling interval and outputs the result of the delaying as delay unit output 224.

First multiplier 227 multiplies delay unit input 221 by contents of coefficient resistor 231 and supplies the result of the multiplication to first adder 228. First adder 228 adds the result of the multiplication of first multiplier 227 and adder input 222 and outputs the result of the addition as adder output 225.

Second multiplier 229 multiplies delay unit input 221 by filter coefficient updating amount 223 and supplies the result of the multiplication to second adder 230. Second adder 230 adds the result of the multiplication of second multiplier 229 and contents of coefficient resistor 231 and stores the result of the addition into coefficient resistor 231.

While the example of the transversal adaptive filter is described above with reference to FIGS. 6 and 7, the present invention can be applied to an arbitrary adaptive filter in which the power of a reference input signal is used for updating of the filter coefficients. For example, the present invention can be applied to a recursive adaptive filter or a non-linear adaptive filter.

Figure 8:
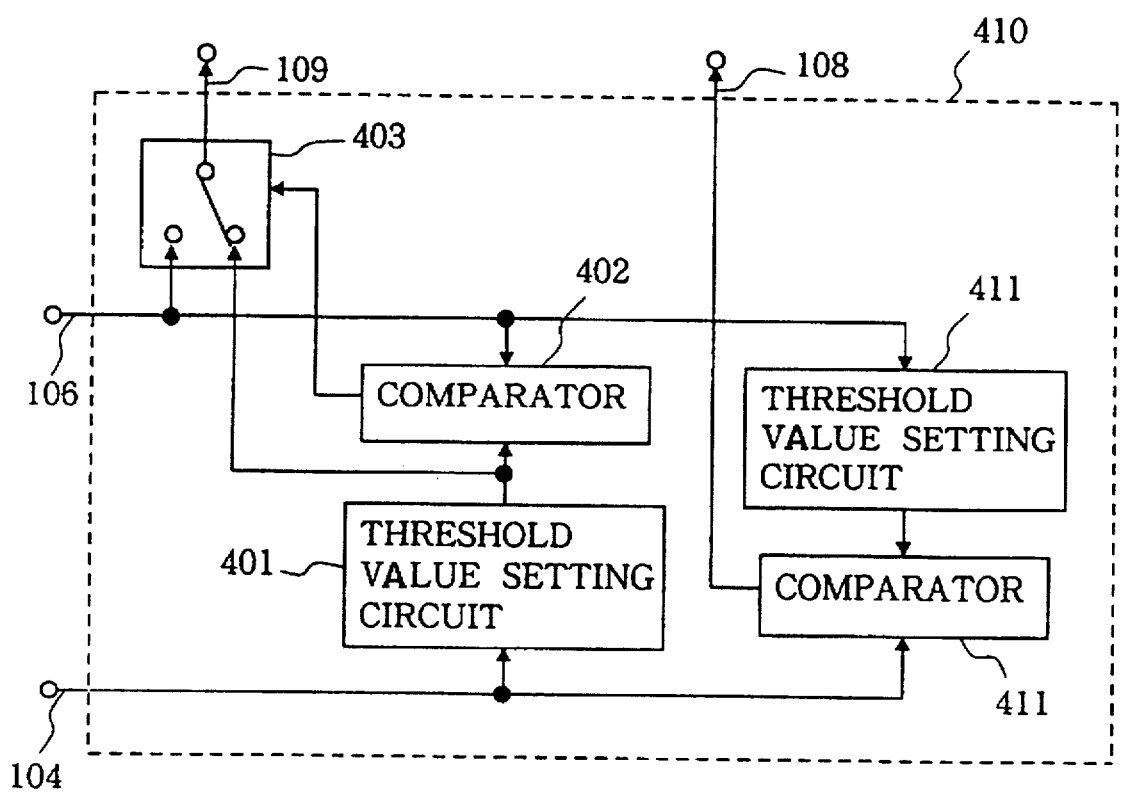
FIG. 8 is a block diagram showing a second form of the power estimation circuit employed in the system identification apparatus of the present invention.

FIG. 8 shows a second form of power estimation circuit 107 in the present invention. The present power estimation circuit 410 receives short-term mean power 104 and long-term mean power 106 as inputs thereto and outputs power estimation control signal 108 and estimated value 109 of the power.

First threshold value setting circuit 401 sets, based on short-term mean power 104, a first threshold value which defines a lower limit of estimated value 109, and supplies the first threshold value to first comparator 402 and selector 403. First comparator 402 compares the first threshold value set by first threshold value setting circuit 401 with long-term mean power 106 and supplies the result of the comparison to selector 403. Selector 403 selects the first threshold value set by first threshold value setting circuit 401 and long-term mean power 106 which has been determined to be greater by first comparator 402, and outputs the selected value as estimated value 109 of the power.

Second threshold value setting circuit 411 sets, based on long-term mean power 106, a second threshold value to be used for determination of whether or not the long-term mean power should be updated, and supplies the thus set second threshold value to second comparator 412. Second comparator 412 compares the second threshold value supplied thereto from second threshold value setting circuit 411 with short-term mean power 104, and produces, when short-term mean power 104 is higher than the second threshold value, a control signal to update the long-term mean power, but in any other case, produces another control signal to maintain the long-term mean power. The thus produced control signal is outputted as power estimation control signal 108.

The first threshold value is set in a similar manner as in the first form of power estimation circuit 107. For setting of the second threshold value, an arbitrary function of long-term mean power 106 can be used. However, if the second threshold value is set higher than long-term mean power 106, then the long-term mean power will exhibit a monotonous increase, and this is not preferable. Preferably, a function which increases monotonously as long-term mean power 106 increases but remains lower than long-term mean power 106 is used. As such function, it is simple to employ a value of long-term mean power 106 multiplied by a positive value lower than 1.

Figure 9:
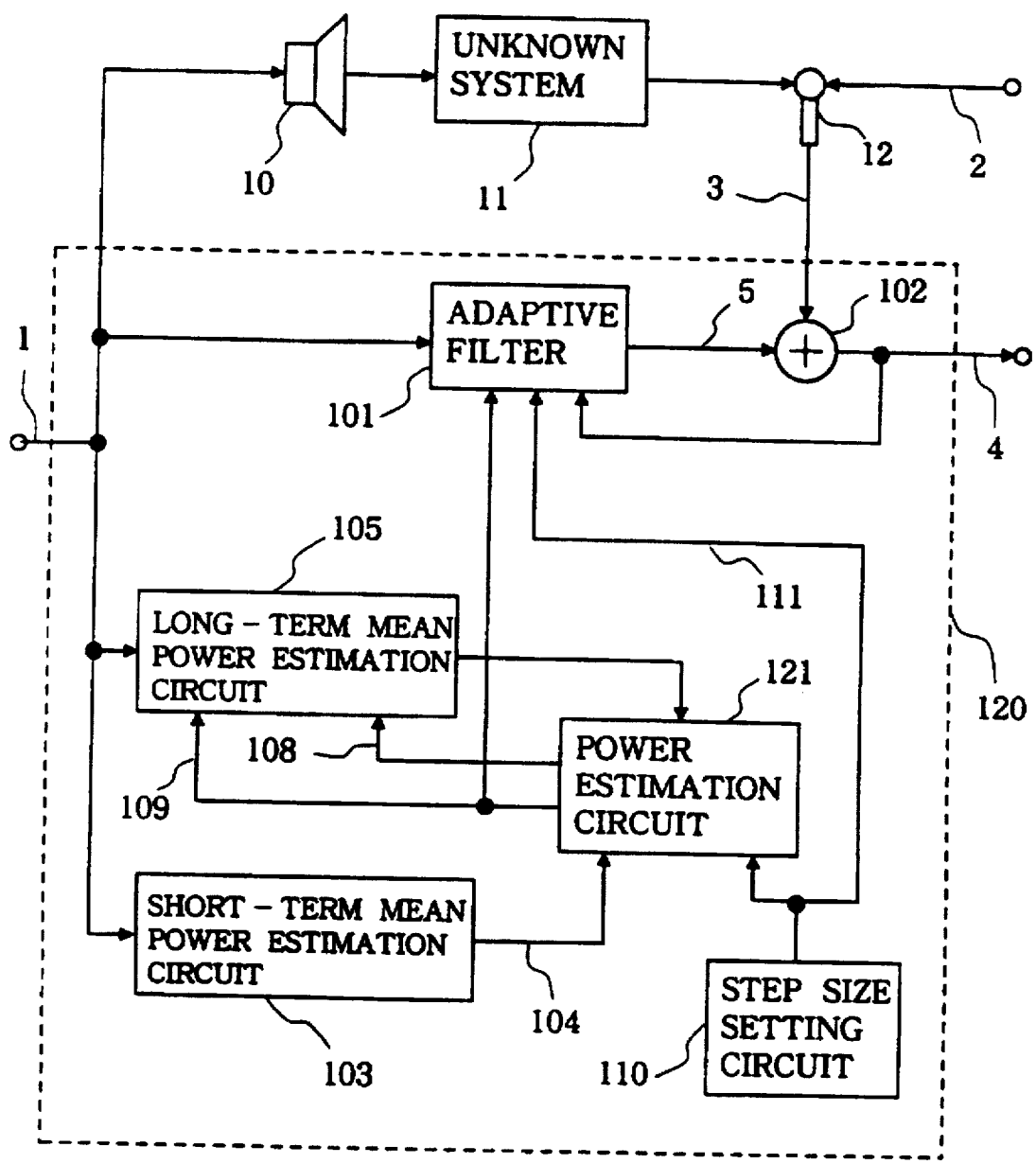
FIG. 9 is a block diagram showing another echo canceller which is a second embodiment of a system identification apparatus of the present invention.

FIG. 9 shows a block diagram of another echo canceller which is a second embodiment of the present invention. In the present embodiment, power estimation circuit 107 in the first embodiment shown in FIG. 2 is replaced by power estimation circuit 121 which estimates the power based on short-term mean power 104, long-term mean power 106 and step size 111. Thus, power estimation circuit 121 is different from power estimation circuit 107 in that it uses also step size 111 for estimation of the power.

Figure 10:
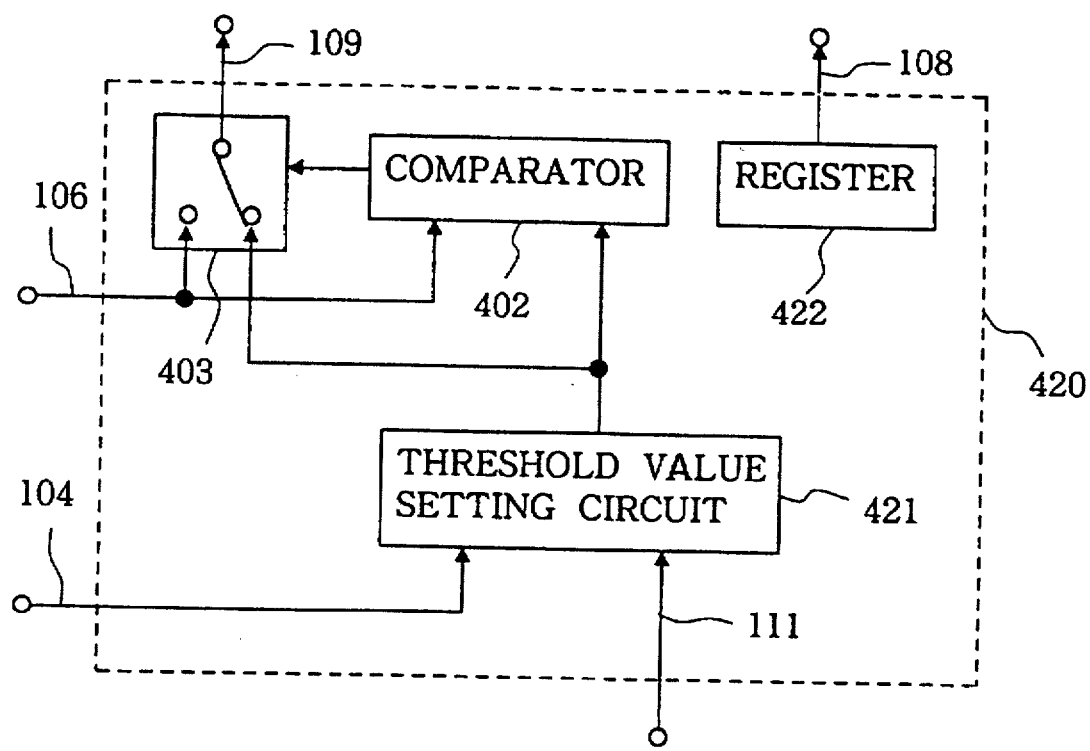
FIG. 10 is a block diagram showing a third form of the power estimation circuit employed in the system identification apparatus of the present invention.

FIG. 10 shows a third form of power estimation circuit 121. The present power estimation circuit 420 includes, in place of threshold value setting circuit 401 in power estimation circuit 400 shown in FIG. 5, threshold value setting circuit 421 which sets a threshold value based on short-term mean power 104 and step size 111. Reference numeral 422 denotes a register.

For setting of the threshold value, an arbitrary function of short-term mean power 104 and step size 111 can be used. Preferably, a function which increases monotonously as short-term mean power 104 increases and as step size 111 increases is used. One of such functions is a function which increases in proportion to short-term mean power 104 and step size 111.

The short-term mean power of the reference input signal is represented by Pxs(t), and the long-term mean power is represented by Pxl(t). A learning identification method which employs short-term mean power Psx(t) wherein the time constant is approximately equal to a number of taps is stable where step size μ is smaller than 2.0. Consequently, even where long-term mean power Pxl(t) is used, it can be seen that the learning identification method is stable if the following expression is met:

$$\frac{\mu}{NPxl(t)} < \frac{2}{NPxs(t)} \quad (20)$$

Accordingly, threshold value Pth(t) should be set so as to satisfy the following expression:

$$\frac{\mu Pxs(t)}{2} \leq Pth(t) \quad (21)$$

For example, a value obtained by multiplying step size μ, short-term mean power Psx(t) and a constant equal to or greater than 0.5 can be used for threshold value. Pth(t).

Figure 11:
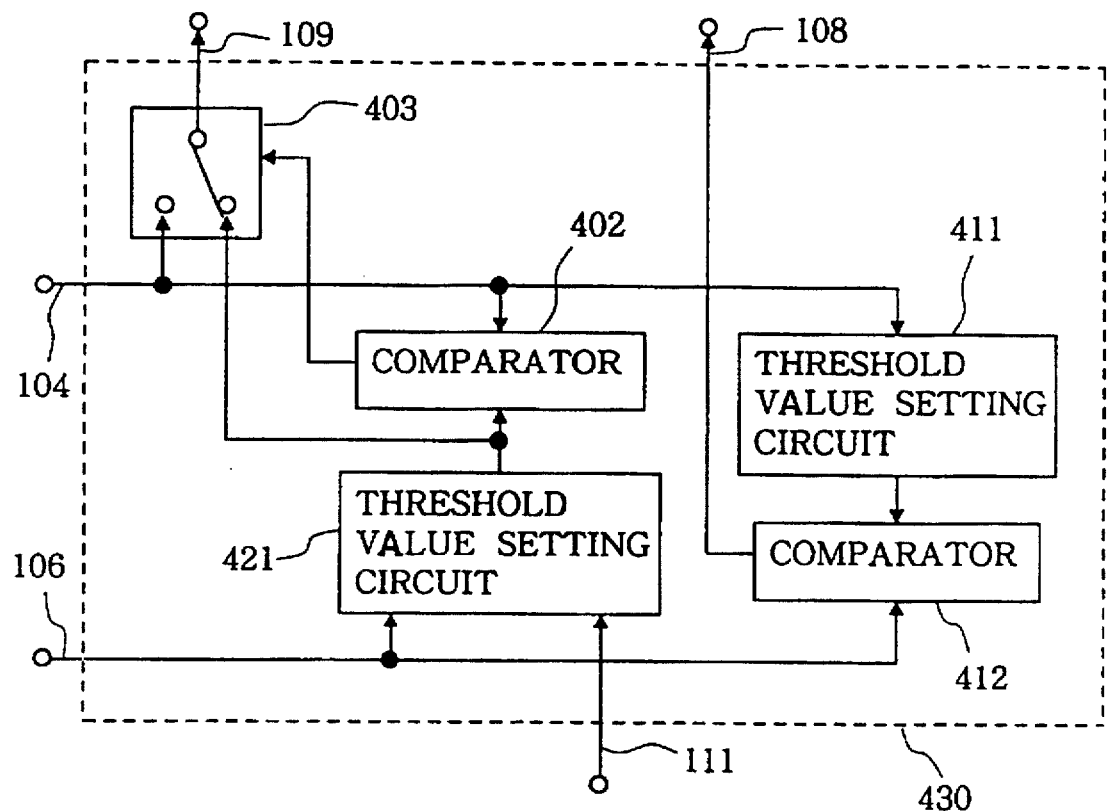
FIG. 11 is a block diagram showing a forth form of the power estimation circuit employed in the system identification circuit of the present invention.

FIG. 11 shows a fourth form of power estimation circuit 121. The present power estimation circuit 430 includes, in place of threshold value setting circuit 401 in power estimation circuit 410 shown in FIG. 8, threshold value setting circuit 421 which sets a threshold value based on short-term mean power 104 and step size 111.

The first threshold value in the present form is set in a similar manner as in the third form of power estimation circuit 121. The second threshold value is set in a similar manner to the second threshold value in the second form of power estimation circuit 121.

I claim:

1. An echo cancellation circuit, comprising:
    an adaptive filter configured to receive a reference input signal, an estimated value of the power of the reference input signal, a step size, and a feedback signal, said adaptive filter providing an output signal;
    a subtractor configured to receive an observation signal and the output signal from the adaptive filter, said subtractor subtracting the output signal from the adaptive filter from the observation signal and outputting the result as an error signal, said error signal being provided to said adaptive filter as said feedback signal;
    a step size setting circuit configured to set the step size and to provide the step size to said adaptive filter;
    a short-term mean power estimator configured to receive said reference input signal and to provide a short-term mean power estimate based on the reference signal;
    a long-term mean power estimator configured to receive said reference input signal and to provide a long-term mean power estimate based on the reference signal; and
    a power estimator configured to receive the short-term mean power estimate and the long-term mean power estimate and to provide the estimated value of the power of the reference input signal based on the short-term mean power estimate and the long-term mean power estimate.

2. The echo cancellation circuit according to claim 1, wherein said power estimator comprises:
- a first threshold circuit configured to receive the short-term mean power estimate and to set a first threshold based on the short-term mean power estimate;
- a first comparator configured to receive the first threshold and the long-term mean power estimate, said first comparator providing an output signal in accordance with a comparison of the first threshold and the long-term mean power estimate; and
- a selector configured to receive the output signal from the first comparator and to output one of the first threshold and the long-term mean power estimate as the estimated value of the power of the reference input signal in accordance with the output signal from the first comparator.

3. The echo cancellation circuit according to claim 1, wherein said long-term mean power estimator is configured to receive the reference input signal and the estimated value of the power of the reference input signal, said long-term mean power estimator further comprising:
- a selector configured to receive a control signal from the power estimator and to select between a first estimated value based on the reference input signal and the estimated value of the power of the reference input signal and a second estimated value based on the estimated value of the power of the reference input signal, said selector providing one of the first estimated value and the second estimated value as the long-term mean power estimate in accordance with the control signal.

4. The echo cancellation circuit according to claim 3, wherein said power estimator further comprises:
- a second threshold configured to receive the long-term mean power estimate and to set a second threshold based on the long-term mean power estimate; and
- a second comparator configured to receive the second threshold and the short-term mean power estimate, said second comparator providing the control signal in accordance with a comparison of the second threshold and the short-term mean power estimate.

5. The echo cancellation circuit according to claim 1, wherein the power estimator is configured to receive the step size from the step size setting circuit, and wherein the estimated value of the power of the reference input signal is based on the short-term mean power estimate, the long-term mean power estimate, and the step size.

6. The echo cancellation circuit according to claim 5, wherein said power estimator comprises:
- a first threshold circuit configured to receive the short-term mean power estimate and the step size and to set a first threshold based on the short-term mean power estimate and the step size;
- a first comparator configured to receive the first threshold and the long-term mean power estimate, said first comparator providing an output signal in accordance with a comparison of the first threshold and the long-term mean power estimate; and
- a selector configured to receive the output signal from the first comparator and to output one of the first threshold and the long-term mean power estimate as the estimated value of the power of the reference input signal in accordance with the output signal from the first comparator.

7. A system identification method wherein an output signal, obtained by processing a reference input signal by an adaptive filter, is subtracted from an observation signal, which includes an output signal of an unknown system and noise, to obtain an error signal, and wherein coefficients of said adaptive filter are modified based on at least the error signal, the reference input signal, an estimated value of a power of the reference input signal and a step size so as to minimize the error signal to estimate a characteristic of the unknown system, comprising the steps of:
- (a) calculating a Short-term mean power obtained by averaging the power of the reference input signal for a short time;
- (b) calculating a long-term mean power obtained by averaging the power of the reference input signal for a long time; and
- (c) calculating the estimated value of the power of the reference input signal based on at least the short-term mean power and the long-term mean power, wherein step (c) comprises the steps of:
- (i) setting a first threshold value based on at least the short-term mean power;
- (ii) providing the first threshold value as the estimated value of the power of the reference input signal when the long-term mean power is lower than the first threshold value; and
- (iii) Providing the long-term mean power as the estimated value of the power of the reference input signal when the long-term mean power is not lower than the first threshold value.

8. A system identification method as claimed in claim 7, wherein, in step (c)(i), the first threshold value is set based on the short-term mean power and the step size.

9. A system identification method as claimed in claim 8, wherein step (b) comprises the steps of:
- (i) setting a second threshold value based on the long-term mean power;
- (ii) updating the long-term mean power based on the reference input signal when the short-term mean power is higher than the second threshold value; and
- (iii) maintaining the long-term mean power when the short-term mean power is not higher than the second threshold value.

10. A system identification method as claimed in claim 9, wherein, in step (b), when the long-term mean power is lower than the first threshold value, the long-term mean power is replaced with the first threshold value.

11. A system identification method as claimed in claim 7, wherein step (b) comprises the steps of:
- (i) setting a second threshold value based on the long-term mean power;
- (ii) updating the long-term mean power based on the reference input signal when the short-term mean power is higher than the second threshold value; and
- (iii) maintaining the long-term mean power when the short-term mean power is not higher than the second threshold value.

12. A system identification method as claimed in claim 8, wherein, in step (b), when the long-term mean power is lower than the first threshold value, the long-term mean power is replaced with the first threshold value.

13. A system identification method as claimed in claim 7, wherein, in step (b), when the long-term mean power is lower than the first threshold value, the long-term mean power is replaced with the first threshold value.

14. A system identification method as claimed in claim 11, wherein, in step (b), when the long-term mean power is lower than the first threshold value, the long-term mean power is replaced with the first threshold value.

15. A system identification apparatus wherein an output signal, obtained by processing a reference input signal by an adaptive filter, is subtracted from an observation signal, which includes an output signal of an unknown system and noise, to obtain an error signal, and wherein filter coefficients of said adaptive filter are modified based on the error signal to estimate a characteristic of the unknown system, said apparatus comprising:

said adaptive filter for obtaining the output signal based on at least the reference input signal and the filter coefficients;

a subtractor for subtracting an output signal of said adaptive filter from the observation signal, which includes the output signal of the unknown system and noise, to obtain the error signal, the subtractor supplying the error signal to the adaptive filter;

a short-term mean power estimation circuit for estimating a short-term mean power which is a short-term mean value of a power of the reference input signal;

a long-term mean power estimation circuit for estimating a long-term mean power which is a long-term mean value of the power of the reference input signal based on at least the reference input signal;

a power estimation circuit for calculating an estimated value of the power of the reference input signal based on at least the short-term mean power and the long-term mean power; and a step size setting circuit for setting a step size, the filter coefficients of said adaptive filter being modified based on at least the error signal, the reference input signal, the estimated value of the power and the step size so as to minimize the error signal to estimate the unknown system, wherein said power estimation circuit includes:

a first threshold value setting circuit for setting a first threshold value based on at least the short-term mean power;

a first comparator for comparing the long-term mean power and the first threshold value with each other; and a selector for selecting, based on the result of the comparison of said first comparator, the greater one of the first threshold value and the long-term mean power and outputting the selected value as the estimated value of the power of the reference input signal.

16. A system identification apparatus as claimed in claim 15, wherein said first threshold value setting circuit sets the first threshold value based on the short-term mean power and the step size.

17. A system identification apparatus as claimed in claim 15, wherein said long-term mean power estimation circuit calculates the long-term mean power based on at least the reference input signal and the estimated value of the power of the reference input signal.

18. A system identification apparatus as claimed in claim 16, wherein said long-term mean power estimation circuit calculates the long-term mean power based on at least the reference input signal and the estimated value of the power of the reference input signal.

19. A system identification apparatus as claimed in claim 16, wherein said long-term mean power estimation circuit updates the long-term mean power based on the reference input signal and the estimated value of the power of the reference input signal when the power estimation control signal instructs updating of the long-term mean power, and otherwise said long-term mean power estimation circuit provides the estimated value of the power of the reference input signal as the long-term mean power.

20. A system identification apparatus wherein an output signal, obtained be processing a reference input signal by an adaptive filter, is subtracted from an observation signal, which includes an output signal of an unknown system and noise, to obtain an error signal, and wherein filter coefficients of said adaptive filter are modified based on the error signal to estimate a characteristic of the unknown system, said apparatus comprising:

the adaptive filter for obtaining the output signal based on at least the reference input signal and the filter coefficients;

a subtractor for subtracting an output signal of said adaptive filter from the observation signal, which includes the output signal of the unknown system and noise, to obtain the error signal, the subtractor supplying the error signal to the adaptive filter;

a short-term mean power estimation circuit for estimating a short-term mean power which is a short-term mean value of a power of the reference input signal;

a long-term mean power estimation circuit for estimating a long-term mean power which is a long-term mean value of the power of the reference input signal based on at least the reference input signal and a power estimation control signal;

a power estimation circuit for calculating an estimated value of the power of the reference input signal based on at least the short-term mean power and the long-term mean power; and a step size setting circuit for setting a step size, the filter coefficients of said adaptive filter being modified based on at least the error signal, the reference input signal, the estimated value of the power and the step size so as to minimize the error signal to estimate the unknown system, wherein said power estimation circuit includes a first threshold value setting circuit for setting a first threshold value based on at least the short-term mean power;

a first comparator for comparing the long-term mean power and the first threshold value with each other;

a selector for selecting, based on the result of the comparison of said first comparator, the greater one of the first threshold value and the long-term mean power and outputting the selected value as the estimated value of the power of the reference input signal;

a second threshold value setting circuit for setting a second threshold value based on the long-term mean power;

a second comparator for comparing the short-term mean power and the second threshold value with each other and supplying the power estimation control signal with an instruction to update the long-term mean power when the short-term mean power is higher than the second threshold value, and otherwise supplying the power estimation control signal with another instruction to maintain the long-term mean power, to said long-term mean power estimation circuit, and wherein said long-term mean power estimation circuit estimates the long-term mean power in accordance with the power estimation control signal.

21. A system identification apparatus as claimed in claim 20, wherein said first threshold value setting circuit sets the first threshold value based on the short-term mean power and the step size.

22. A system identification apparatus as claimed in claim 21, wherein said long-term mean power estimation circuit calculates the long-term mean power based on at least the reference input signal and the estimated value of the power of the reference input signal.

23. A system identification apparatus as claimed in claim 20, wherein said long-term mean power estimation circuit updates the long-term mean power based on the reference input signal and the estimated value of the power of the reference input signal when the power estimation control signal instructs updating of the long-term mean power, and otherwise said long-term mean power estimation circuit provides the estimated value of the power of the reference input signal as the long-term mean power.

24. A system identification apparatus as claimed in claim 21, wherein said long-term mean power estimation circuit updates the long-term mean power based on the reference input signal and the estimated value of the power of the reference input signal when the power estimation control signal instructs updating of the long-term mean power, and otherwise said long-term mean power estimation circuit provides the estimated value of the power of the reference input signal as the long-term mean power.

* * * * *